United States Patent
Ikuta et al.

(10) Patent No.: US 7,485,972 B2
(45) Date of Patent: Feb. 3, 2009

(54) SEMICONDUCTOR DEVICE

(75) Inventors: Teruhisa Ikuta, Nara (JP); Hiroyoshi Ogura, Kyoto (JP); Yoshinobu Sato, Toyama (JP); Toru Terashita, Toyama (JP); Hisao Ichijo, Kyoto (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 11/356,144

(22) Filed: Feb. 17, 2006

(65) Prior Publication Data

US 2006/0202240 A1  Sep. 14, 2006

(30) Foreign Application Priority Data

Feb. 21, 2005  (JP)  ............... 2005-043292

(51) Int. Cl.
*H01L 23/12* (2006.01)
(52) U.S. Cl. ...................... 257/784; 257/786
(58) Field of Classification Search ............ 257/784, 257/786
See application file for complete search history.

(56) References Cited

U.S. PATENT DOCUMENTS

| 3,787,717 A | * | 1/1974 | Fischer et al. ............... 257/360 |
| 4,636,832 A | * | 1/1987 | Abe et al. ................... 257/786 |
| 5,272,371 A | * | 12/1993 | Bishop et al. ............... 257/362 |
| 5,751,065 A | * | 5/1998 | Chittipeddi et al. ......... 257/758 |
| 5,986,343 A | * | 11/1999 | Chittipeddi et al. ......... 257/758 |
| 6,187,658 B1 | * | 2/2001 | Chittipeddi et al. ......... 438/612 |
| 6,448,641 B2 | * | 9/2002 | Ker et al. .................... 257/700 |
| 6,509,625 B1 | * | 1/2003 | Casey ......................... 257/554 |
| 6,633,087 B2 | * | 10/2003 | Ker et al. .................... 257/786 |
| 6,864,562 B1 | * | 3/2005 | Toyosawa et al. ........... 257/637 |
| 6,995,084 B2 | * | 2/2006 | Srivastava et al. .......... 438/613 |

FOREIGN PATENT DOCUMENTS

| JP | 63283138 A | 11/1988 |
| JP | 03-070181 | 3/1991 |
| JP | 09-289304 | 11/1997 |
| JP | 2001-015547 | 1/2001 |

\* cited by examiner

*Primary Examiner*—S. V Clark
(74) *Attorney, Agent, or Firm*—Steptoe & Johnson LLP

(57) ABSTRACT

Provided is a semiconductor device which includes a conductive bonding pad formed on a semiconductor substrate of the first conduction type via an insulating film and a diffusion layer of the second conduction type formed on a surface of the semiconductor substrate under the bonding pad. Characteristics do not deteriorate even when a breakdown occurs during wire bonding.

8 Claims, 8 Drawing Sheets

US 7,485,972 B2

SEMICONDUCTOR DEVICE

FIELD OF THE INVENTION

The present invention relates to a semiconductor device and, more particularly, to a bonding pad provided in an integrated circuit chip for high-voltage use.

BACKGROUND OF THE INVENTION

Generally, in a semiconductor circuit chip, for example, an integrated circuit chip, bonding pads are formed on a surface of the chip in order to electrically connect the interior of the chip to the outside.

The construction of a bonding pad of a semiconductor device will be described below (refer to the Japanese Patent Laid-Open No. 63-283138, for example). A sectional view of a conventional semiconductor device is shown in FIG. 8.

As shown in FIG. 8, upon a surface of a P type silicon substrate 1 below a bonding pad 4, there is formed an N type diffusion layer 2 of a conduction type reverse to that of the P type silicon substrate 1. This N type diffusion layer 2 is formed to suppress a deterioration of characteristics of an integrated circuit chip which is caused by the breakdown of an insulating film 3 immediately under the bonding pad 4 due to a mechanical shock during wire bonding or the application of an excessive surge voltage. This is because when a leak or a short circuit occurs between the bonding pad 4 and the P type silicon substrate 1, a reverse bias is applied to a PN junction between the P type silicon substrate 1 and the N type diffusion layer 2, whereas when the voltage applied to the bonding pad is a low voltage, a reverse-direction leak current scarcely flows, thereby not causing a deterioration of the characteristics of the integrated circuit chip.

However, in a case where a leak or a short circuit occurs between the bonding pad and the silicon substrate and furthermore a high voltage is applied to the bonding pad, there is a possibility that a deterioration of the characteristics of the integrated circuit chip may occur. This is because when a leak or a short circuit occurs, a high voltage is applied also to the N type diffusion layer below the bonding pad and, therefore, in the case of the application of a voltage higher than a breakdown voltage of the N type diffusion layer and the P type silicon substrate, an avalanche breakdown occurs and a large current flows, thereby causing a malfunction of a device within the integrated circuit chip.

Therefore, when a high voltage is to be applied, it is necessary that a breakdown voltage of a PN junction between the P type silicon substrate and the N type diffusion layer be higher than a voltage which is applied.

However, when a curvature of the N type diffusion layer is large, electric field is increased in end portions of the N type diffusion layer and, therefore, it is difficult to raise the breakdown voltage. For example, if it is supposed that the PN junction is a cylindrical one-side abrupt junction and that the impurity concentration of the P type silicon substrate is $1 \times 10^{15}$ (cm−3), then the N type diffusion layer has a depth of 3 µm and the breakdown voltage of the diffusion layer is 90 V or so. Therefore, in order to make the breakdown voltage 200 V or so, it is necessary that the diffusion depth of the N type diffusion layer be as deep as not less than 10 µm.

Usually, in an N type diffusion layer, an N well layer having a diffusion depth in the range of 3 to 5 µm or so, which is used in a standard CMOS process, is often used. However, for the above-described reason, as a diffusion layer below a bonding pad to which a high voltage of 200 V is applied, such an N well layer cannot be used as it is. For this reason, it is necessary to change process conditions and to add another N type diffusion layer. This has hitherto posed the problem of a cost increase.

DISCLOSURE OF THE INVENTION

In view of the above circumstances, the present invention has as its object the provision of a semiconductor device for high voltage in which high-voltage devices and the like are integrated and which is provided with a bonding pad which does not cause a deterioration in characteristics even when a destruction occurs during wire bonding.

To achieve the above object, a semiconductor device of the present invention comprises a conductive bonding pad formed on a semiconductor substrate of the first conduction type via an insulating film and a diffusion layer of the second conduction type formed on a surface of the semiconductor substrate under the bonding pad. In this semiconductor device, the diffusion layer is not formed below ends of the bonding pad.

It is preferred that the semiconductor device further comprises a high-concentration diffusion layer of the first conduction type formed on a surface of the semiconductor substrate so as to enclose the bonding pad.

It is preferred that the semiconductor device further comprises a passivation film having an opening on the bonding pad, and that below the bonding pad covered with the passivation film, there is formed a PN junction by the diffusion layer and the semiconductor substrate.

It is preferred that the semiconductor substrate of the semiconductor device is an SOI (Silicon On Insulator) substrate having a P type silicon layer formed on a support substrate via a buried insulating film.

It is preferred that the diffusion layer of the semiconductor substrate extends to the buried insulating film.

Further, a semiconductor device according to another aspect of the present invention comprises a silicon layer of a first conduction type formed on a support substrate via a buried insulating film, a conductive bonding pad formed on the silicon layer via the buried insulating film, and a diffuser layer of a second conduction type formed on a surface of the silicon layer under the bonding pad, wherein the bonding pad extends to the silicon layer outward of the diffusion layer.

It is preferred that the diffusion layer of the semiconductor device extends to the buried insulating film.

It is preferred that the semiconductor device further comprises a high-concentration diffusion layer of the first conduction type formed on a surface of the silicon layer so as to enclose the bonding pad.

It is preferred that the high-concentration diffusion layer of the semiconductor device extends to the buried insulating film.

It is preferred that the semiconductor device further comprises a passivation film having an opening on the bonding pad, wherein a PN junction is formed by the diffusion layer and the silicon layer below the bonding pad covered with the passivation film.

In the semiconductor device of the present invention, when a positive high voltage is applied to a bonding pad after the occurrence of a leak or a short circuit between the bonding pad and the semiconductor substrate, it is possible to improve the breakdown voltage between the diffusion layer and the semiconductor substrate which connect electrically to the bonding pad. That is, it is possible to raise an applied voltage which causes a deterioration of characteristics. This is because in a case where the bonding pad extends to above the semiconductor substrate of the first conduction type which is present outwardly of the diffusion layer of the second conduction type, a peripheral part of the bonding pad obtains the role of a field plate when a high voltage is applied, and lessens electric fields at the ends of the diffusion layer of the second conduction type, thereby improving the breakdown voltage.

As in the SOI substrate, it is possible to improve much more the breakdown voltage between the diffusion layer and the semiconductor layer.

The breakdown voltage when such a field plate effect is present can be substantially improved by increasing the thickness of an insulating film as calculated in a document by ADRIAN RUSU, Deep-Depletion Breakdown Voltage of Silicon-Dioxide/Silicon MOS Capacitors, IEEE TRANSACTIONS ON ELECTRON DEVICES, March 1979, VOL. ED-26, No. 3, p.p. 201-205.

Furthermore, in the above-described semiconductor device, the high-concentration diffusion layer of the first conduction type is provided so as to enclose the bonding pad with a spacing between the bonding pad and this can stop a depletion region which expands outward from the surface of the semiconductor substrate of the first conduction type below the ends of the bonding pad which has the role of a field plate. As a result of this, the insulation from elements around the bonding pad can be ensured.

DESCRIPTION OF THE EMBODIMENTS

First Embodiment

The construction of a bonding pad in the first embodiment of the present invention will be described below with reference to the drawings. A sectional view and a plan view of a semiconductor device of this embodiment are shown respectively in FIG. 1 and FIG. 2.

Figure 1:
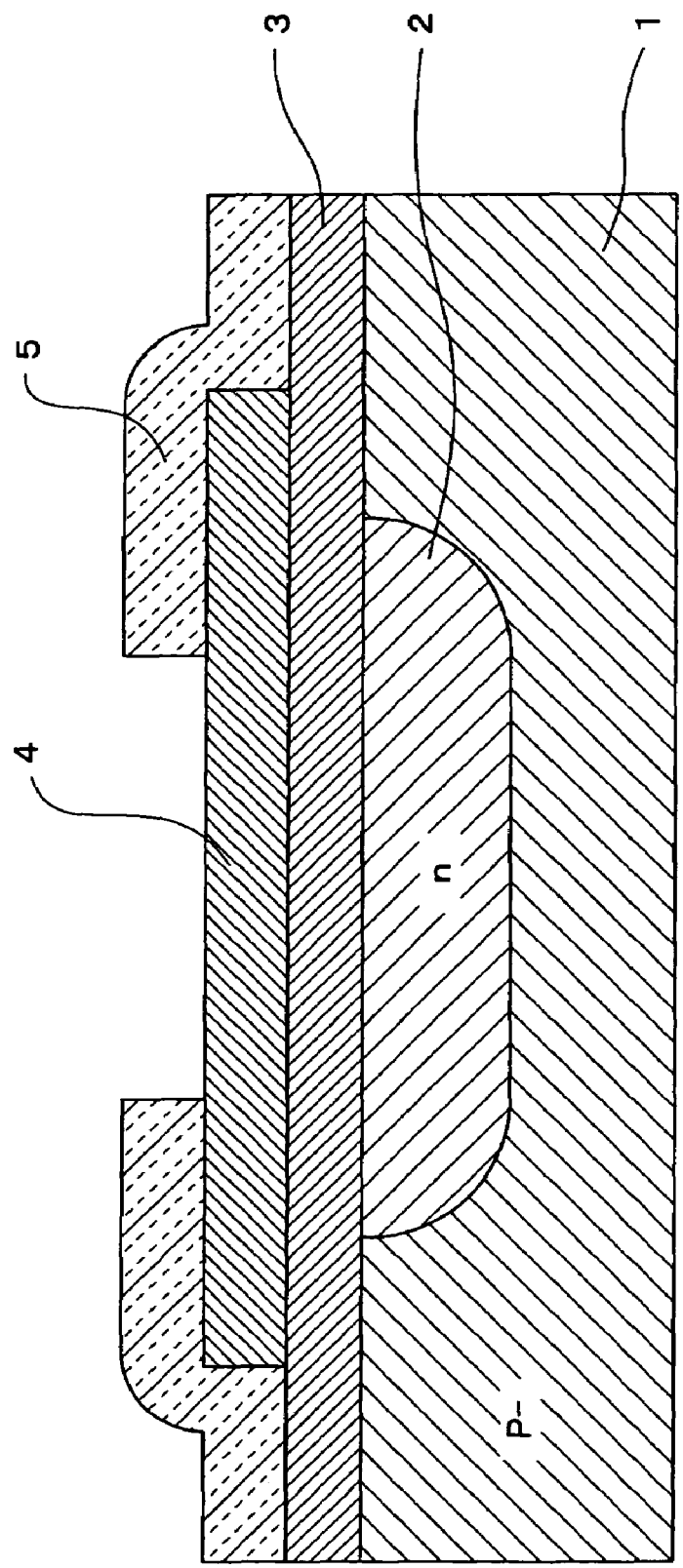
FIG. 1 is a sectional view of a bonding pad according to the first embodiment of the present invention.
Figure 2:
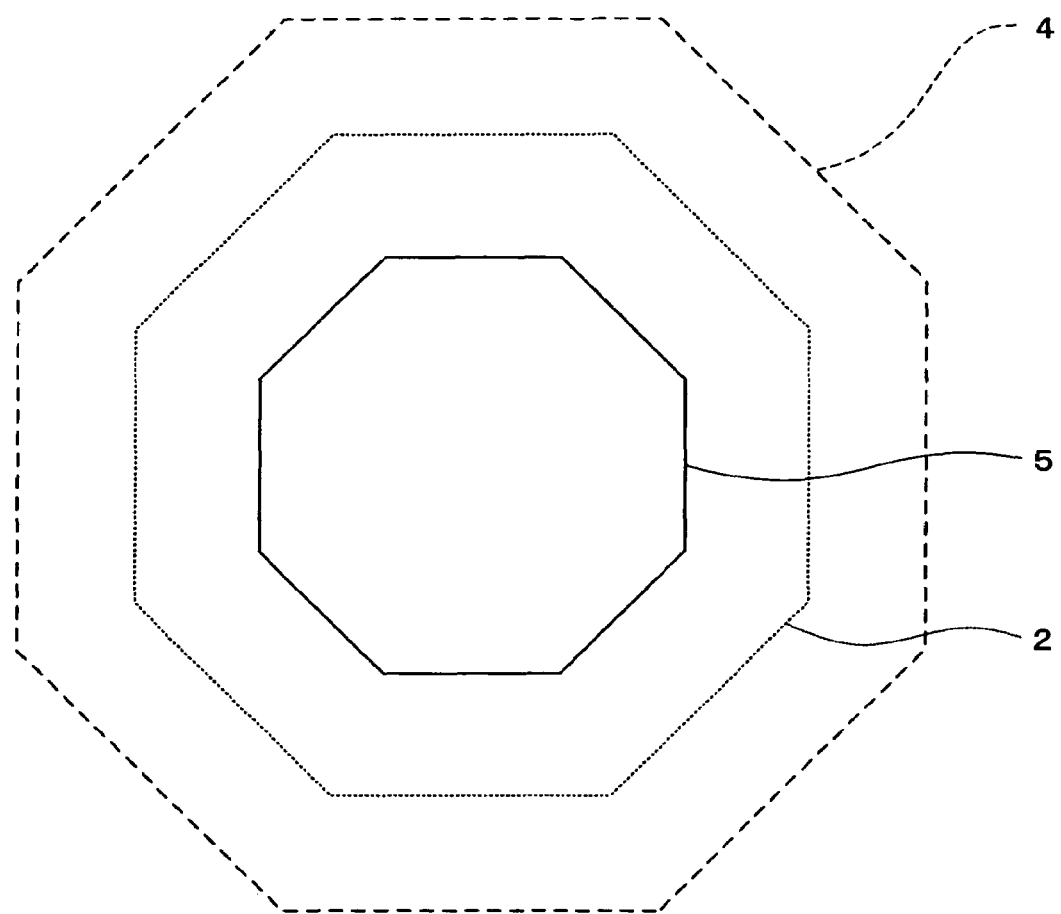
FIG. 2 is a plan view of the bonding pad according to the first embodiment of the present invention.

As shown in FIG. 1, a bonding pad 4 which contains aluminum as a main component is formed on a P type silicon substrate 1 having a resistivity of 5 to 10 Ω·cm as a semiconductor substrate via an insulating film 3. This insulating film 3 is a silicon oxide film having a film thickness of 1.2 μm or so. Upon the bonding pad 4, there is formed a passivation film 5 of a film thickness of 1 μm or so which has an opening. Below the bonding pad 4 is formed an N type diffusion layer 2 having a surface concentration of $1 \times 10^{17}$ cm−3 or so. As shown in FIG. 2, the bonding pad 4 extends above the surface of the P type silicon substrate 1 outwardly of the N type diffusion layer 2.

Figure 3:
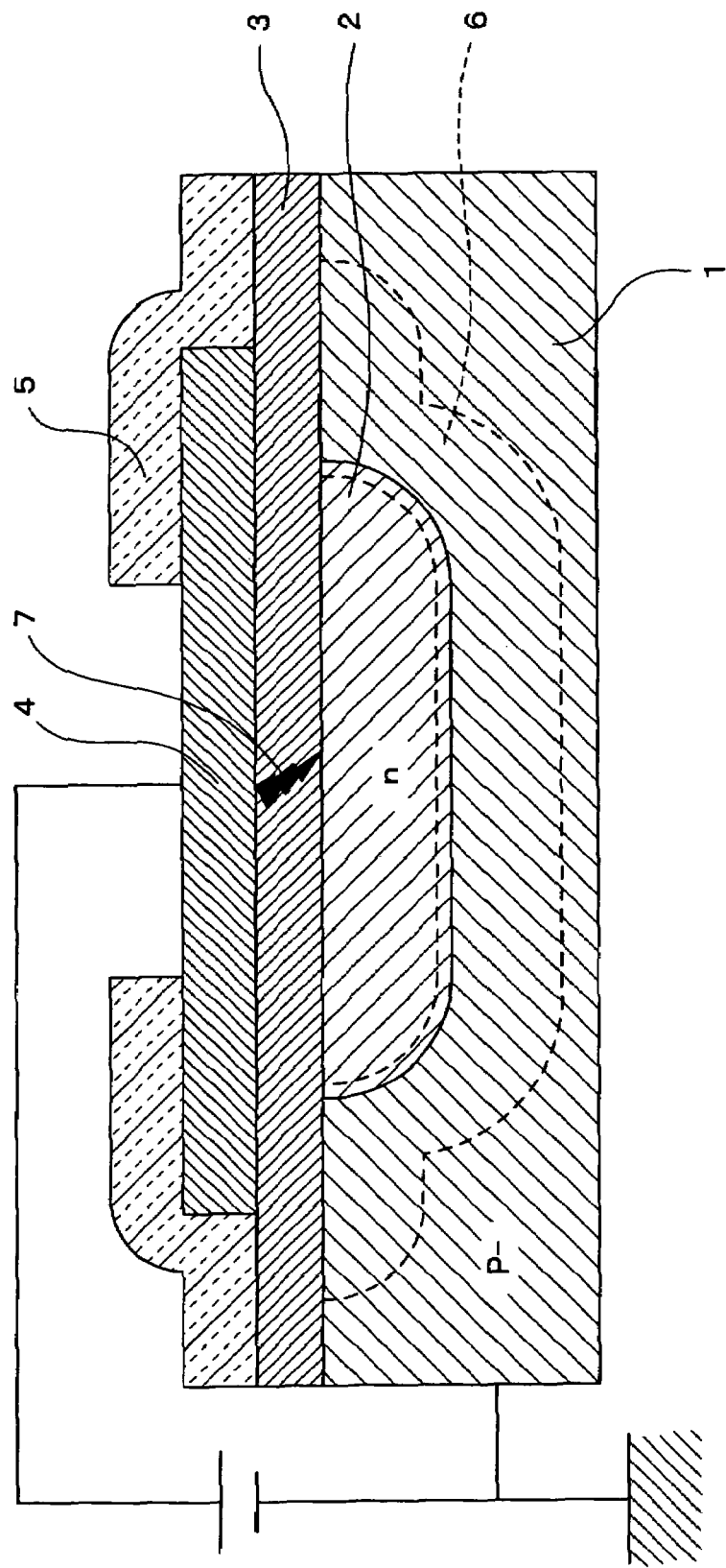
FIG. 3 is a sectional view showing a condition when a high voltage is applied after a breakdown of an insulating film immediately under the bonding pad according to the first embodiment of the present invention.

Next, consideration will be given to a case where a leak or a short circuit occurs between the bonding pad 4 and the N type diffusion layer 2 due to a destruction of the insulating film 3 under the bonding pad 4 during wire bonding. FIG. 3 shows the condition when a high voltage is applied to the bonding pad 4. The voltage applied to the bonding pad 4 is applied also to the N type diffusion layer 2 via a portion of destruction 7.

When a reverse bias is applied to between the N type diffusion layer 2 and the P type silicon substrate 1, a one-side steep junction occurs because the impurity concentration of the N type diffusion layer 2 is higher than the impurity concentration of the P type silicon substrate 1, with the result that a depletion region 6 expands in the P type silicon substrate 1. Furthermore, because bonding pad 4 has the role of a field plate, the depletion region 6 expands also on the surface of the P type silicon substrate 1 below the ends of the bonding pad 4. For this reason, electric fields at the ends of the N type diffusion layer are lessened and it is possible to improve the breakdown voltage of the PN junction to 200 V or so. Therefore, it is possible to realize a bonding pad in which a deterioration of characteristics does not occur even when high voltages of up to 200 V are applied.

Incidentally, when a PN junction by the N type diffusion layer 2 and the P type silicon substrate is formed below the bonding pad 4 covered with the passivation film 5, the portion of destruction 7 by wire bonding is formed without exception on the N type diffusion layer 2. For this reason, a leak or a short circuit does not occur between the bonding pad 4 and the P type silicon substrate 1 and, therefore, it is possible to positively prevent a deterioration of characteristics caused by wire bonding.

Second Embodiment

The construction of a bonding pad in the second embodiment of the present invention will be described below with reference to the drawings. A sectional view and a plan view of a semiconductor device of this embodiment are shown respectively in FIG. 4 and FIG. 5. A description will be given only of points in which the second embodiment is different from the first embodiment.

Figure 4:
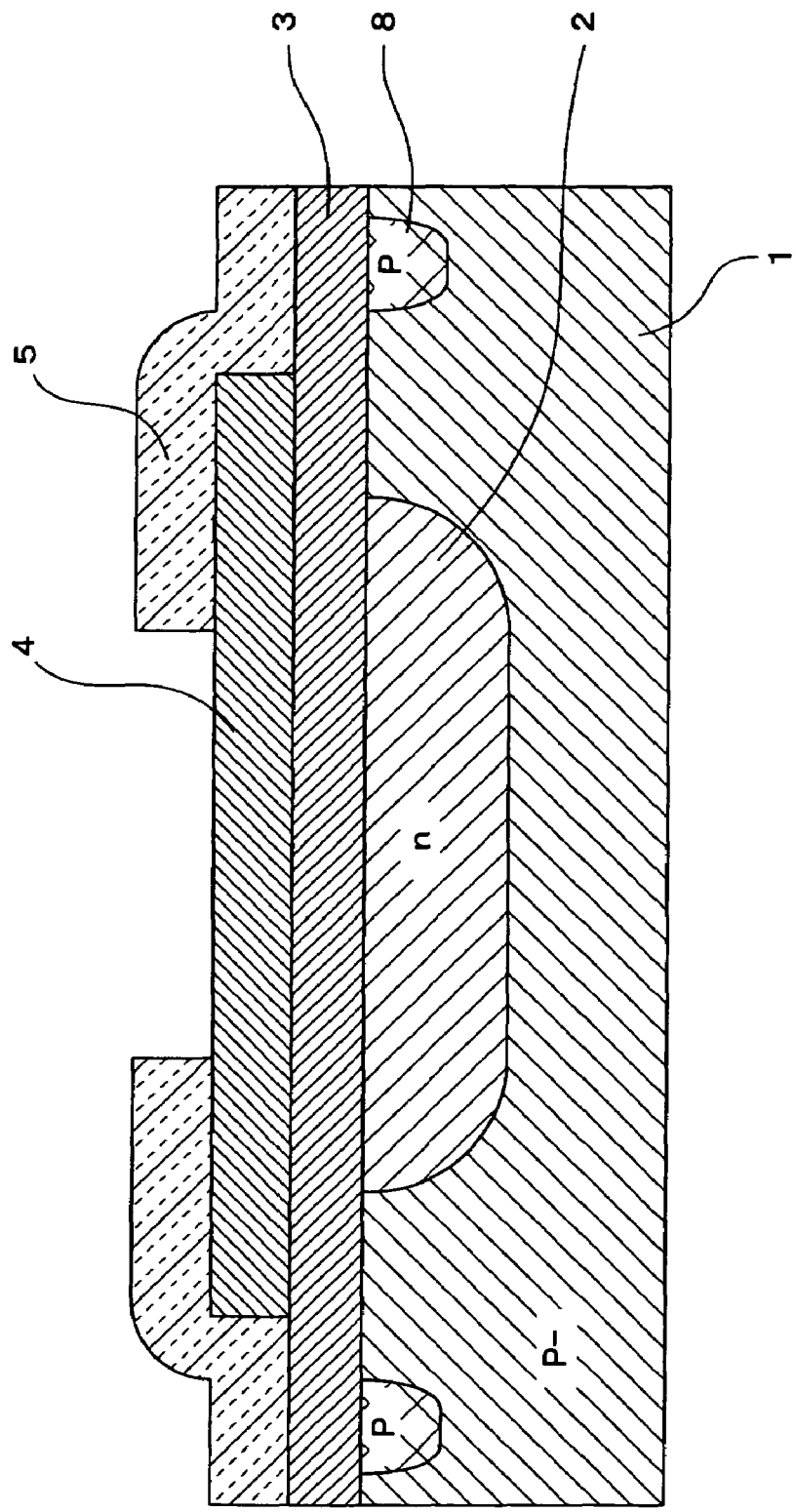
FIG. 4 is a sectional view of a bonding pad according to the second embodiment of the present invention.
Figure 5:
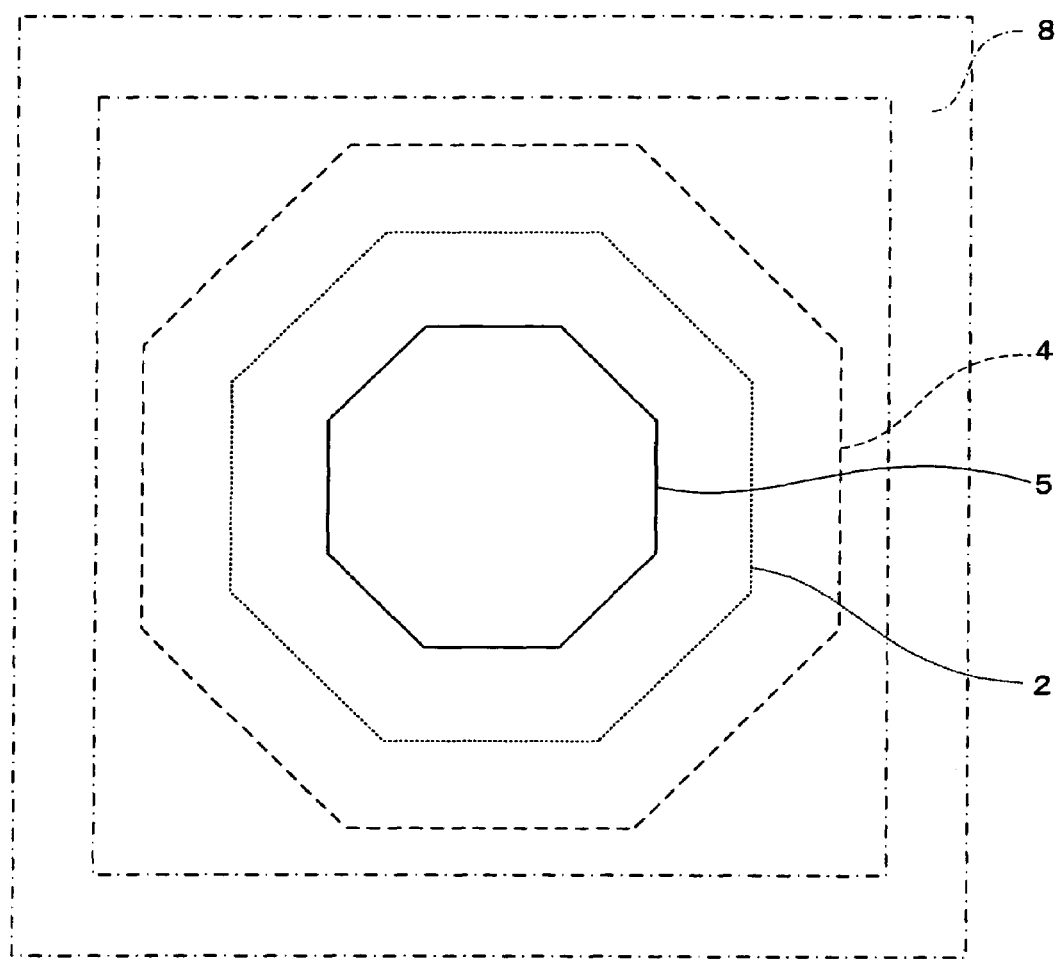
FIG. 5 is a plan view of the bonding pad according to the second embodiment of the present invention.

As shown in FIGS. 4 and 5, a P type diffusion layer 8 having a higher concentration than a P type silicon substrate 1 is formed on a surface of the P type silicon substrate 1 so as to enclose a bonding pad 4.

Figure 6:
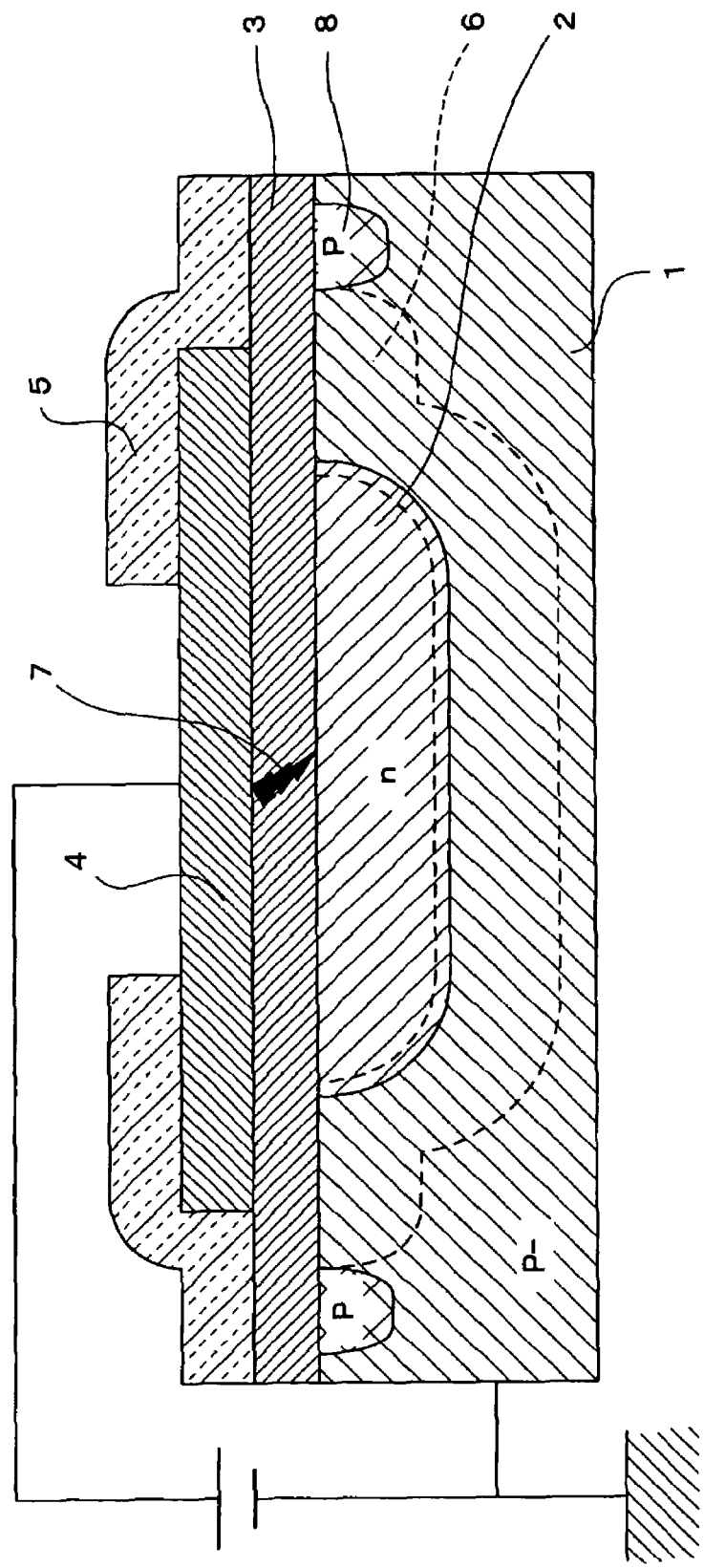
FIG. 6 is a sectional view showing a condition when a high voltage is applied after a breakdown of an insulating film immediately under the bonding pad according to the second embodiment of the present invention.

Next, in the same manner as in the first embodiment, consideration will be given to a case where a leak or a short circuit occurs between a bonding pad 4 and an N type diffusion layer 2 due to a destruction of an insulating film 3 immediately under the bonding pad 4. FIG. 6 shows the condition when a high voltage is applied to the bonding pad 4. Even when a depletion region 6 expands outward from the P type silicon substrate 1 below ends of the bonding pad 4 due to the application of a reverse bias, the expansion of the depletion region 6 is stopped by the P type diffusion layer 8 of high concentration and, therefore, it is possible to suppress the effect of the depletion region 6 on external elements.

Figure 7:
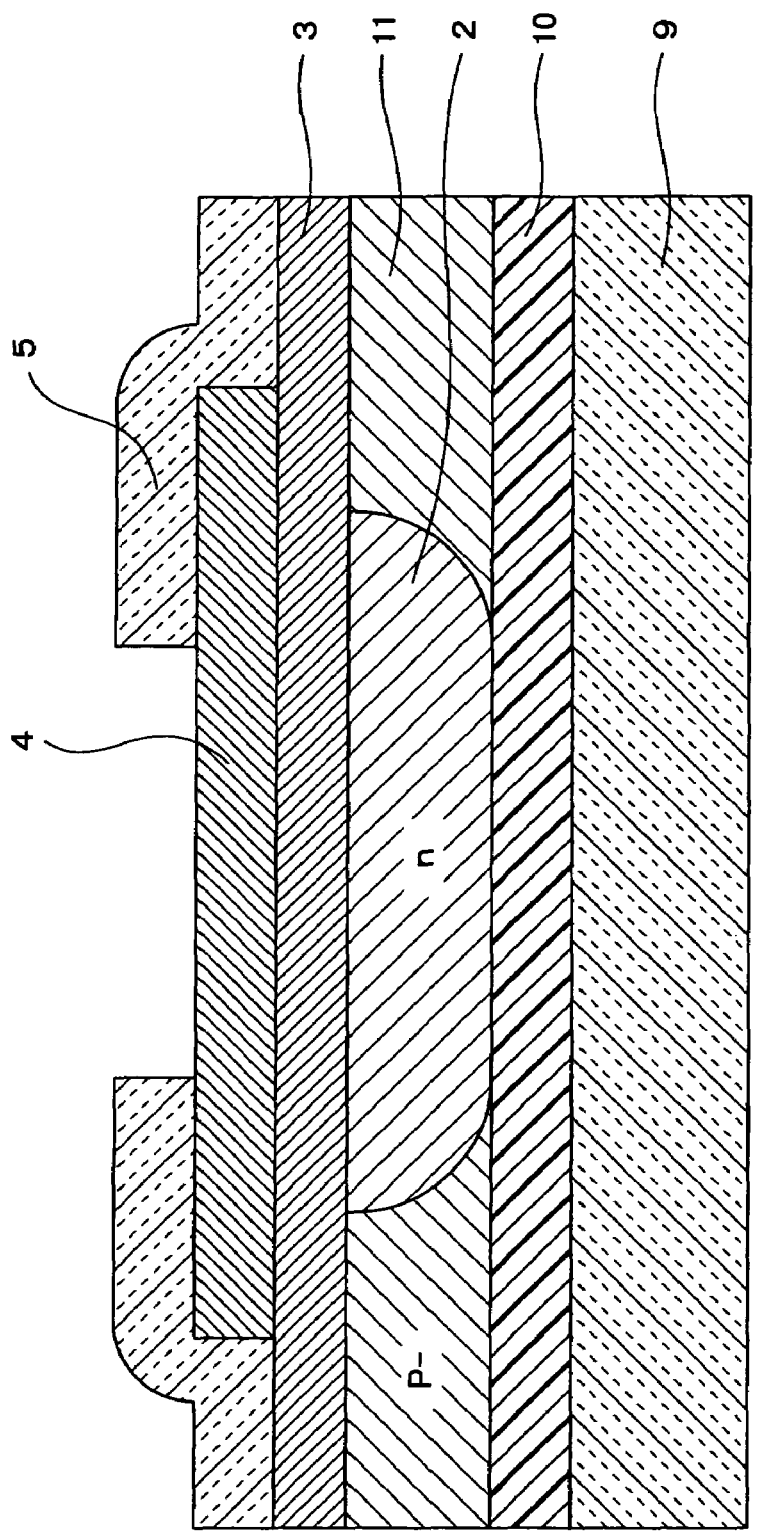
FIG. 7 is a sectional view of the bonding pad according to the present invention which is formed on an SOI substrate.
Figure 8:
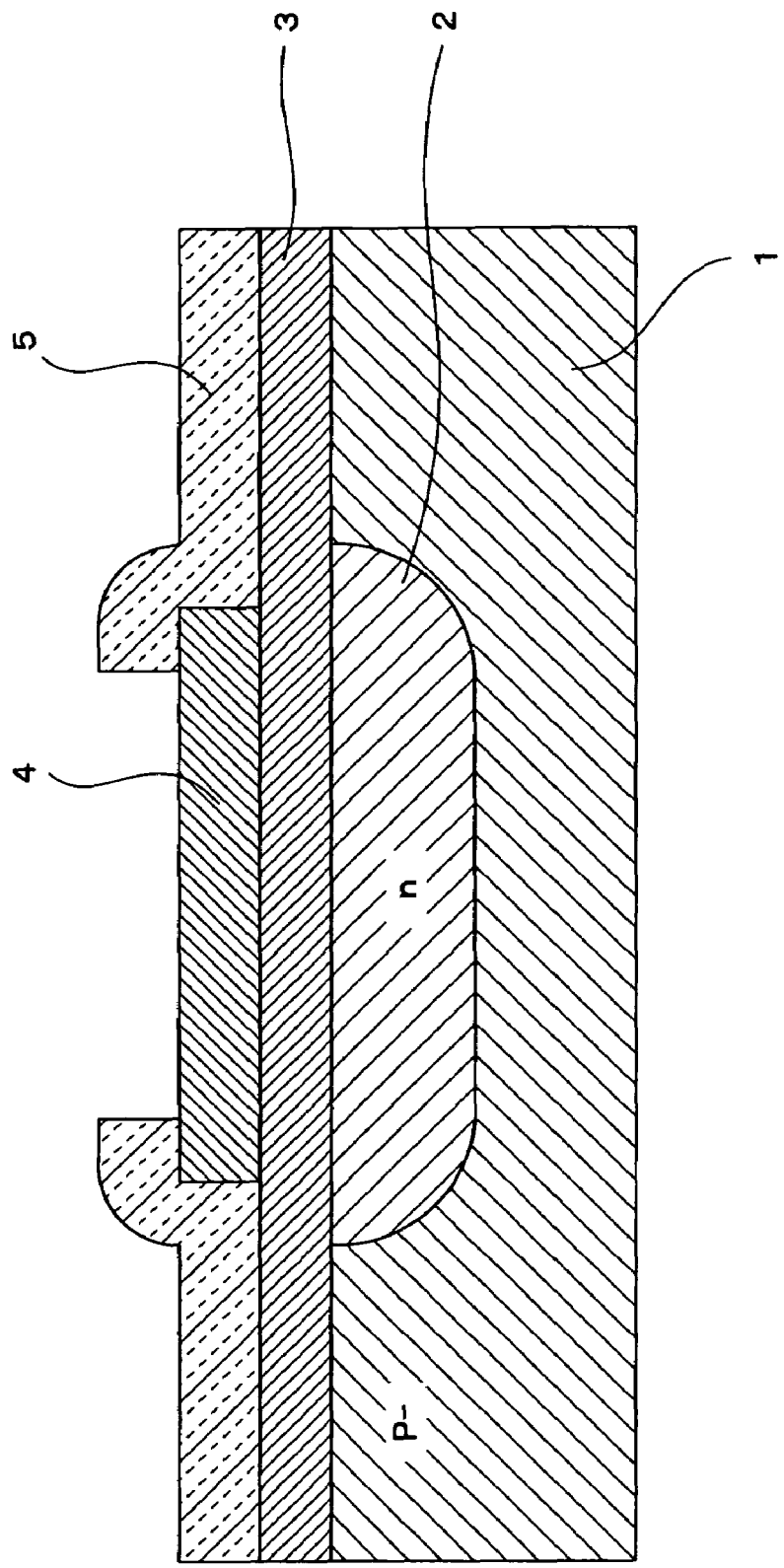
FIG. 8 is a sectional view of a conventional bonding pad.

Incidentally, the bonding pad of the present invention is not limited to the above-described embodiments and, as shown in FIG. 7, the bonding pad may be formed on an SOI substrate in which a P type silicon layer 11 is formed on a support substrate 9 via a buried insulating film 10.

The present invention is useful in a semiconductor device for high voltage and the like.

What is claimed is:

1. A semiconductor device, comprising:

a semiconductor substrate of a first conduction type a diffusion layer of a second conduction type on an inside surface portion of the semiconductor substrate, the second conduction type being an opposite of the first conduction type;

an insulating film on a surface of said substrate and said diffusion layer, and a conductive bonding pad on said insulating film, above said diffusion layer, the horizontal edges of said conductive bonding pad extending beyond the horizontal edges of said diffusion layer of the second conduction type, thereby diminishing electric fields at ends of the diffusion layer and improving a breakdown voltage of a PN junction at a boundary of the diffusion layer and the semiconductor substrate, wherein a diffusion layer of the second conduction type is not formed on a surface region of the semiconductor substrate directly under a horizontal edge of the bonding pad, the surface region being the semiconductor substrate of a first conduction type that extends continuously from a PN junction of the diffusion layer.

2. The semiconductor device according to claim 1, further comprising a high-concentration diffusion layer of the first conduction type on an inside surface portion of the semiconductor substrate, such that the high-concentration diffusion layer surrounds in a horizontal direction an area of the semiconductor substrate beneath the bonding pad, wherein an impurity concentration of the high-concentration diffusion layer is higher than that of the semiconductor substrate of the first conduction type.

3. The semiconductor device according to claim 1, further comprising a passivation film on said insulating layer and said bonding pad, said passivation film having an opening on the bonding pad and covering a portion of the insulating film and the bonding pad.

4. The semiconductor device according to claim 1, wherein the semiconductor substrate is an SOI substrate having a P type silicon layer formed on a support substrate via a buried insulating film.

5. The semiconductor device according to claim 4, wherein the diffusion layer extends to the buried insulating film.

6. A semiconductor device, comprising:

a support substrate;

a first insulating film on said support substrate;

a silicon layer of a first conduction type on said first insulating film and touching said first insulating film;

a diffusion layer of a second conduction type on an inside surface of said silicon layer;

a second insulating film on the silicon layer and said diffusion layer and touching the silicon layer and the diffusion layer; and a conductive bonding pad on the second insulating film, above said diffusion layer, the horizontal edges of said conductive bonding pad extending beyond the horizontal edges of said diffusion layer, thereby diminishing electric fields at ends of the diffusion layer and improving a breakdown voltage of a PN junction at a boundary of the diffusion layer and the silicon layer, the conductive bonding pad touching the second insulating film wherein a diffusion layer of the second conduction type is not on a surface region of the silicon layer directly under a horizontal edge of the bonding pad, the surface region being the silicon layer of a first conduction type that extends continuously from a PN junction of the diffusion layer.

7. The semiconductor device according to claim 6, wherein the diffusion layer extends to the first insulating film.

8. The semiconductor device according to claim 6, further comprising a passivation film having an opening on the bonding pad, said passivation film covering a portion of the second insulating film and the bonding pad.

* * * * *